US011812550B2

United States Patent
Zhou et al.

(10) Patent No.: US 11,812,550 B2
(45) Date of Patent: Nov. 7, 2023

(54) EMBEDDING METHOD OF A FLAT HEAT PIPE INTO PCB FOR ACTIVE DEVICE COOLING

(71) Applicant: Toyota Motor Engineering & Manufacturing North America, Inc., Plano, TX (US)

(72) Inventors: Feng Zhou, Ann Arbor, MI (US); Ercan Mehmet Dede, Ann Arbor, MI (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 179 days.

(21) Appl. No.: 17/166,205

(22) Filed: Feb. 3, 2021

(65) Prior Publication Data
US 2022/0141951 A1    May 5, 2022

Related U.S. Application Data

(60) Provisional application No. 63/107,714, filed on Oct. 30, 2020.

(51) Int. Cl.
*H05K 1/02* (2006.01)
*H05K 1/18* (2006.01)
(Continued)

(52) U.S. Cl.
CPC ........... *H05K 1/0272* (2013.01); *H05K 1/185* (2013.01); *H05K 3/30* (2013.01); *H05K 2201/10166* (2013.01); *H05K 2201/10174* (2013.01)

(58) Field of Classification Search
CPC .... H05K 1/0203; H05K 1/0272; H05K 1/185; H05K 1/02; H05K 1/18; H05K 1/181;
(Continued)

(56) References Cited

U.S. PATENT DOCUMENTS 10,356,891 B2    7/2019  Kim
2012/0236500 A1*  9/2012  Higuchi ............... H01L 23/473
                                                    361/699

(Continued)

FOREIGN PATENT DOCUMENTS

CN    202535633 U    11/2012
CN    209861242 U    12/2019
(Continued)

OTHER PUBLICATIONS

Basic PCB Manufacture_Willis_pp. 1-17_Dec. 2018.*
(Continued)

*Primary Examiner* — Timothy J Thompson
*Assistant Examiner* — Guillermo J Egoavil
(74) *Attorney, Agent, or Firm* — Dinsmore & Shohl LLP

(57) ABSTRACT

Embedded cooling systems and methods of forming the same are disclosed. A system includes a PCB stack comprising a first major substrate opposite a second major substrate, a pre-preg layer disposed between the first and second major substrates, a power device stack embedded within the PCB stack and comprising a substrate, a power device coupled to the substrate of each power device stack, and a flat heat pipe having a first end embedded in the PCB stack and a second end extending outside the PCB stack, the power device stack being coupled to the flat heat pipe.

19 Claims, 19 Drawing Sheets

(51) Int. Cl.
*H05K 3/30* (2006.01)
*H05K 7/20* (2006.01)

(58) Field of Classification Search
CPC ........ H05K 1/0204; H05K 1/117; H05K 3/30;
H05K 3/4602; H05K 3/4697; H05K
3/4644; H05K 7/20; H05K 7/20336;
H05K 7/20936; H05K 2201/10166; H05K
2201/10174; H05K 2201/10416; H05K
2201/064; H05K 2201/10515; H05K
2201/09063; H05K 2201/093; H05K
2201/10159; H05K 2201/10522
USPC .................................................. 361/700, 704
See application file for complete search history.

(56) References Cited

U.S. PATENT DOCUMENTS

| | | | | |
|---|---|---|---|---|
| 2018/0145017 | A1* | 5/2018 | Tsai | H01L 21/486 |
| 2021/0291670 | A1* | 9/2021 | Kaufman | B60L 58/12 |
| 2022/0157693 | A1* | 5/2022 | Zhou | H01L 25/072 |
| 2022/0322582 | A1* | 10/2022 | Fujioka | H05K 1/0206 |
| 2022/0361315 | A1* | 11/2022 | Zhou | H05K 1/181 |
| 2023/0022829 | A1* | 1/2023 | Zhou | H01L 23/3735 |

FOREIGN PATENT DOCUMENTS

| | | | | |
|---|---|---|---|---|
| EP | 3216325 | A1 | 9/2017 | |
| JP | 4140100 | B2 | 6/2008 | |
| KR | 20050117482 | A | 12/2005 | |
| KR | 100791982 | B1 | 1/2008 | |
| KR | 100830174 | B1 | 5/2008 | |
| KR | 100862203 | B1 | 10/2008 | |
| KR | 20170038229 | A * | 4/2017 | B32B 3/26 |

OTHER PUBLICATIONS

Integrated cooling concepts for printed circuit boards (https://core.ac.uk/download/pdf/11463853.pdf); Dec. 4, 2008.
Advances in integrated heat pipe technology for printed circuit boards (https://pdfs.semanticscholar.org/f678/c9987206d2a2d91eb10b27301bec28fd5729.pdf; 2010.

* cited by examiner

EMBEDDING METHOD OF A FLAT HEAT PIPE INTO PCB FOR ACTIVE DEVICE COOLING

CROSS-REFERENCE TO RELATED APPLICATIONS

This application claims the benefit of U.S. Provisional Application No. 63/107,714, entitled "EMBEDDING METHOD OF A FLAT HEAT PIPE INTO PCB FOR ACTIVE DEVICE COOLING," filed Oct. 30, 2020, the entirety of which is hereby incorporated by reference.

TECHNICAL FIELD

The present disclosure generally relates to heat transfer components and, more specifically, to cooling systems embedded within substrates having embedded power devices, the substrates utilizing flat heat pipes for the purposes of cooling the embedded power devices.

BACKGROUND

Power control units (PCUs) include power cards having power devices, cooling device(s), gate drivers, printed circuit board (PCB), capacitors, and other components. A component of the PCU is a power card, which contains power devices that may be switched on and off in high frequency during operation of a vehicle, for example. These power devices may generate significant amounts of heat. Conventional power cards have designs for exposing surface area of the power devices for cooling purposes. Some PCU configurations include power cards that are sandwiched within liquid cooled units to maintain a proper temperature while they are switching on and off, because switching generates heat. Furthermore, the power cards are connected to the driver board through pin connections. Such power cards may be mounted to a driver board via pins and may extend a distance from the driver board, leading to a larger volume profile, which includes a small power density and a high system loop inductance, resulting in a high power loss, especially at high switching frequencies. Improvements within the PCU structure are desirable to improve the power density and cooling of the PCU.

SUMMARY

In one aspect, a system includes a PCB stack comprising a first major substrate opposite a second major substrate, a pre-preg layer disposed between the first and second major substrates, a power device stack embedded within the PCB stack and comprising a substrate, a power device coupled to the substrate of each power device stack, and a flat heat pipe having a first end embedded in the PCB stack and a second end extending outside the PCB stack, the power device stack being coupled to the flat heat pipe.

In another aspect, a method includes forming a PCB stack having a first major substrate opposite a second major substrate and a pre-preg layer disposed between the first and second major substrates, forming a recess within the PCB stack to receive a power device stack coupled to a flat heat pipe, and embedding the power device stack coupled to the flat heat pipe within the recess, the flat heat pipe comprising first and second ends, the first end embedded within the PCB stack and the second end extending outside of the PCB stack.

In yet another aspect, a system includes a printed circuit board (PCB) stack comprising a first major substrate opposite a second major substrate and a pre-preg layer disposed between the first and second major substrates, a plurality of power device stacks embedded within the PCB stack, each comprising a substrate having a cavity formed therein and an electrical insulation layer disposed on a surface of the substrate opposite the cavity, a plurality of power devices, each of the plurality of power devices received within the cavity of the substrate of each of the plurality of power device stacks and thermally coupled to the substrate, one or more flat heat pipes having a first end embedded within the PCB stack and thermally bonded to the electrical insulation layer of one or more of the plurality of power device stacks and a second end extending outside of the PCB stack, and at least one cooling assembly arranged externally to the PCB stack such that the second end of the one or more flat heat pipes partially disposed within the at least one cooling assembly.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
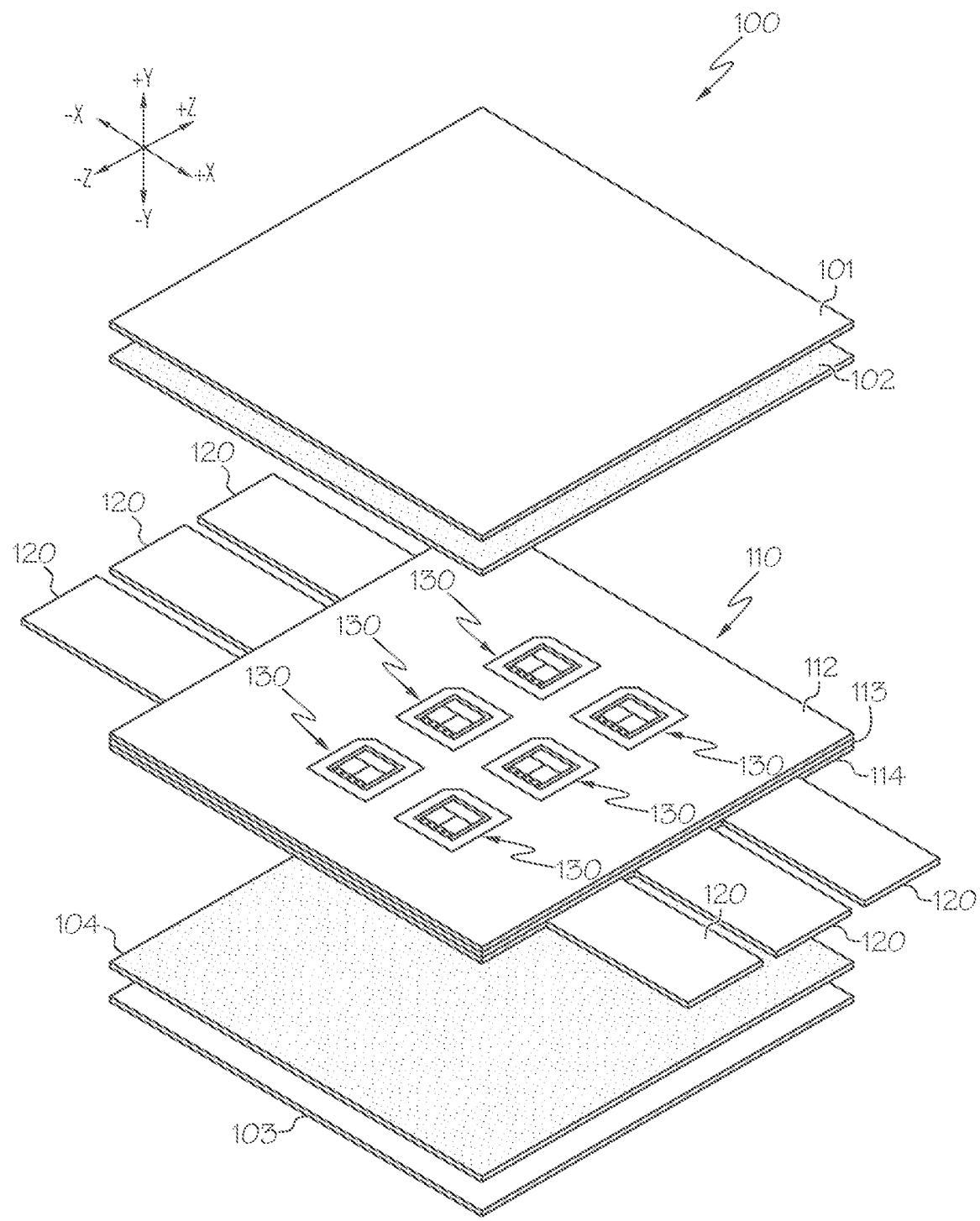
FIG. 1 schematically depicts an exploded perspective view of an illustrative embedded cooling system including a multi-layer printed circuit board (PCB) stack with a plurality of embedded power devices and a plurality of embedded flat heat pipes according to one or more embodiments shown and described herein.

The devices described herein generally relate to embedded cooling systems that include power devices (e.g., embedded power semiconductor devices) and flat heat pipes embedded within substrates such as gate driver printed circuit boards (PCBs). The embedded power devices shown and described herein utilize copper layers, pre-impregnated ("pre-preg") layers, and/or copper vias to form an inverter topology, a convertor topology, or a similar topology. Various configurations are shown and described herein. One or more of the copper layers are formed to receive the embedded heat pipes, which are configured to extend from the copper layer(s) to a location outside of the substrate, the location having a cooling assembly (e.g., a condenser) to facilitate heat transfer.

Each structure shown and described herein provides advantages over traditional topologies (e.g., surface mounted power device topologies) because of the location and configuration of particular components. For example, the power device embedded substrates described herein provide smaller system volumes, lighter system weights, higher system power densities (e.g., power modules that include power device embedded PCBs are configured to operate at 40 kilowatts (kW) or more), lower overall inductances that deliver smaller switching losses, particularly at high switching frequency, overall lower cost, and/or more easily fits into new and unique locations within a vehicle (e.g., within wheels or the like).

Furthermore, embodiments described herein propose various embedded power semiconductor devices within a substrate. The topologies further provide improved cooling of the system by reducing and/or eliminating thermal resistance layers between the power semiconductor devices and coolers such as vapor chambers and/or cold plates. By doing so, the device can maintain lower running temperatures with the same cooling performance or run at a higher power output as heat may be removed more efficiently. Embodiments shown and described herein reduce and/or eliminate the external electrical isolation layer (and grease layer) and provide a more direct and improved thermal conductive path for removing heat from a power semiconductor device.

Some configurations include a PCB having power devices embedded therein. The power devices may be bonded to copper substrates. The copper substrates, because of the need to electrically couple one or more conductive power layers from one or more surfaces of the power device, the power devices must be electrically isolated outside of the PCB, which reduces the thermal conductivity of the power control unit.

In general, traditional power device embedded PCB configurations utilize the electrical conductive properties of the copper substrates to connect to the power devices through a second surface, for example, the bottom of the copper substrates via vias. However, since the copper substrates are coupled via one or more vias, the thermal conductance from the power devices and the copper substrates is reduced since a cold plate and/or vapor chamber may not be bonded to the copper substrates but rather to the power devices through vias and one or more copper layers used to electrically couple and control the power devices. That is, due to power layers connecting to the power devices from a first surface and a second surface of the power device, vias are needed and thus restrict thermal conduction from the copper substrates and the corresponding power devices.

Accordingly, traditional power device embedded PCB configurations connect an electrical insulation layer via one or more grease layers to a cold plate and optionally another electronic device such as a power capacitor that needs to be cooled. Other traditional embodiments connect an electrical insulation layer via one or more grease layers to a vapor chamber and/or a cold plate and optionally another electronic device such as a power capacitor that needs to be cooled.

In contrast, embodiments according to the present disclosure provide electronic assembly configurations that improve thermal conductivity of the power devices embedded in the substrates. In particular, some embodiments implement a direct bonded insulation device such as a direct bonded copper substrate, a direct bonded aluminum device, or an active metal bonding substrate to the power semiconductor device at a first surface and directly to a flat heat pipe at a second surface opposite the first surface, the flat heat pipe being at least partially embedded within the substrate and thermally coupled to a condenser that is located outside the substrate.

As shown and described herein, new implementations of flat-type heat pipes at least partially embedded within a substrate are provided. Turning now to the drawings wherein like numbers refer to like structures, and particularly to FIG. 1, schematically depicts a perspective view of an illustrative embedded cooling system including a multi-layer printed circuit board (PCB) stack with a plurality of embedded power devices and a plurality of embedded flat heat pipes. In general, the PCB stack 100 includes a plurality of substrate layers 101, 112, 114, and 103 such as copper, gold, silver, aluminum or an alloy thereof interspersed by pre-preg layers 102, 113, and 104, respectively. The plurality of substrate layers 101, 112, 114 and 103 and pre-preg layers 102, 113, and 104 may be laminated together. Processes such as etching, milling, laser drilling, and the like may be implemented to create electrical connections within a substrate layer, vias between substrate layers, recesses for receiving embedded components such as flat heat pipes 120 and power devices or power device stacks 130.

As depicted in FIG. 1, the embedded cooling system is integrated within the power embedded PCB substrate 110 of the PCB stack 100. The power embedded PCB substrate 110 includes a first major substrate 112 (e.g., a top surface, facing the +Y direction of the coordinate axes of FIG. 1) opposite a second major substrate 114 (e.g., a bottom surface, facing the −Y direction of the coordinate axes of FIG. 1) and a pre-preg layer 113 disposed between the first major substrate and the second major substrate. One or more flat heat pipes 120 are positioned within the pre-preg layer 113. Additionally, one or more power device stacks 130 are thermally coupled to the one or more flat heat pipes 120 and further disposed within the power embedded PCB substrate 110. In some embodiments, additional substrate layers 101 and 103 and pre-preg layers 102 and 104 laminated to the power embedded PCB substrate 110. The additional substrate layers maybe one or more power conductive layers for electrically coupling to the one or more power devices of the one or more power device stacks. In some embodiments, the additional substrate layers may include one or more active or passive components electrically coupled thereto. Illustrative embodiments of the embedded cooling system will be described in more detail herein. Additionally, methods for forming the embedded cooling system will also be described in herein.

Embodiments of the present disclosure contemplate the implementation of flat heat pipes 120 for extracting heat from a power device embedded within a PCB stack 100. In particular, embedded flat heat pipes 120 provide a more direct means of removing heat from power devices to cooling systems external to the PCB stack 100. While flat heat pipes 120 are disclosed herein other sizes, shapes, and types of heat pipes may be implemented.

Figure 2:
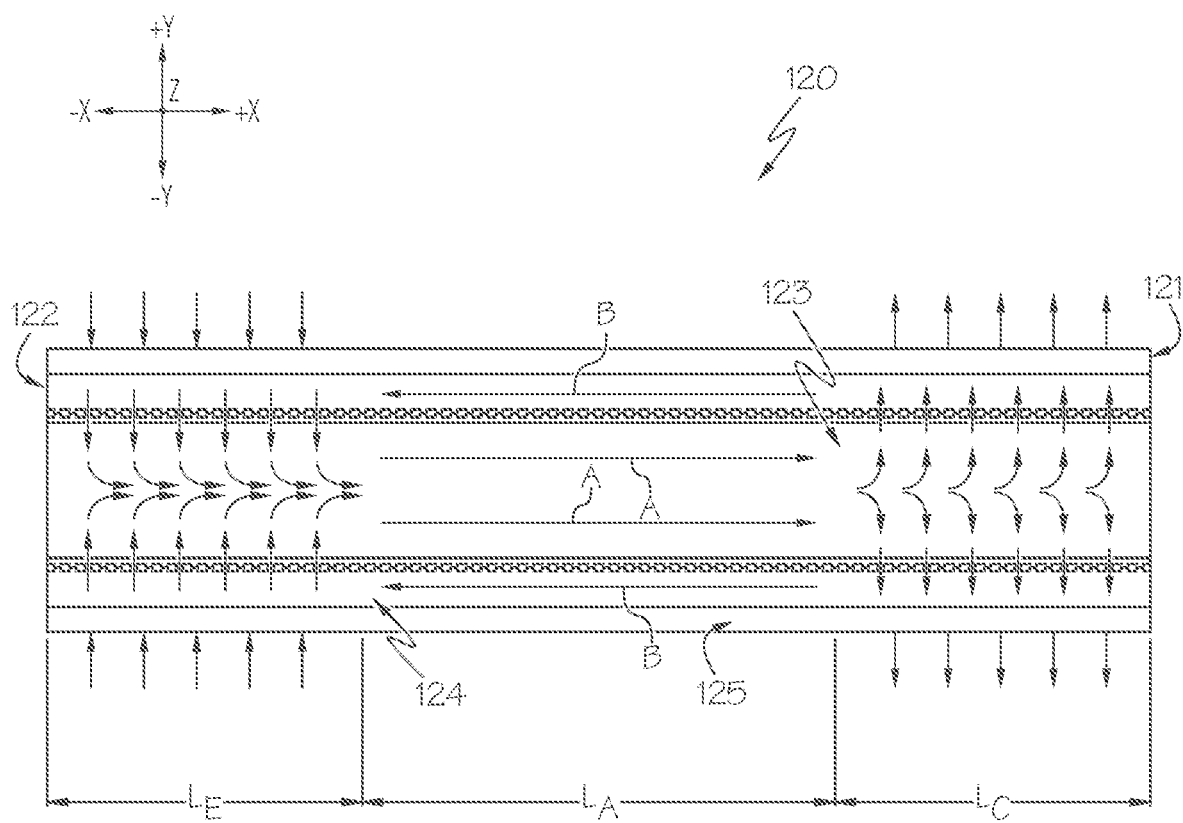
FIG. 2 depicts a cross-sectional side view of an illustrative flat heat pipe according to one or more embodiments shown and described herein.

FIG. 2 depicts a cross-sectional side view of an illustrative flat heat pipe 120 and schematically depicts vapor, liquid, and heat flows during the flat heat pipe 120. While the particular structure of a flat heat pipe 120 may vary, in general, a flat heat pipe 120 includes an outer casing (e.g., comprising a top surface 121 and a bottom surface 125) which are formed to mate with each other along their outer edges to form an enclosure defining a void space 123 therein. The inner surface of the outer casing may include porous media 122, 124 sintered to the inner wall and charged with a liquid. The outer casing of a flat heat pipe 120 may comprise copper, aluminum, silver, gold, or other thermally conductive material. Furthermore, the porous media 122, 124 may be sinter metal particles such as copper, aluminum, gold, silver, or other thermally conductive material.

The length of the flat heat pipe 120 may be defined by three portions, each having a different function. A first end, $L_E$, which may also be referred to as an evaporator length, receives heat from a thermally coupled heat source such as a power device stack 130. The heat causes the liquid within the porous media 122, 124 to vaporize and flow within the void space 123 (e.g., as indicated by arrows A), through a middle portion, LA, to a second end, $L_C$, which may also be referred to as a condenser length. As the vapor moves away from the source of heat, the vapor may begin to condense. The vapor may condense at the second end, $L_C$, and be transferred back in to the porous media 122, 124. The porous media 122, 124 may act as a conduit that allows the liquid to return to the first end, $L_E$, through the middle portion, LA, as indicated, for example, by arrows B. The vapor-liquid-vapor cycle within the flat heat pipe 120 promotes heat transfer from the source of heat received at a first end, $L_E$, to be expelled at the second end, $L_C$. In embodiments, the second end, $L_C$, may be further coupled to an external cooling system that may further increase the condensing operation of the vapor to liquid and removal of heat from the flat heat pipe 120.

Figure 3:
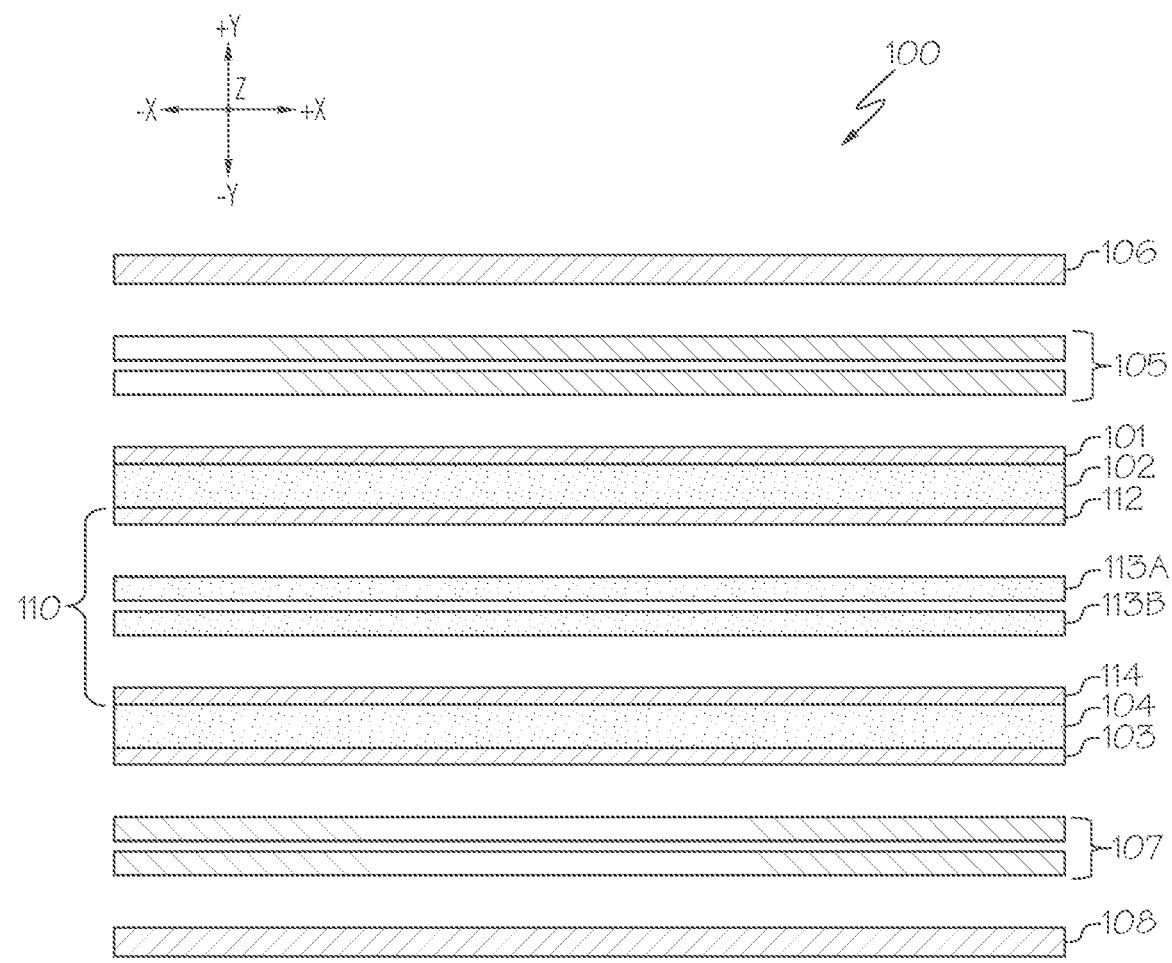
FIG. 3 depicts an exploded cross-sectional side view of an illustrative multi-layer PCB stack according to one or more embodiments shown and described herein.

Before turning to detailed embodiments of the present disclosure, a brief discussion of a PCB stack 100 is provided. FIG. 3 depicts an illustrative 6-layer PCB stack 100 according to one or more embodiments shown and described herein. While a 6-layer PCB stack 100 is depicted, this is merely an example. PCB stacks 100 may include more or fewer layers. In general, PCB stacks 100 include multiple layers laminated to each other. For example, the layers may include conductive substrate layers 101, 103, 106, 108, 112, and 114 and electrical insulating layers 102, 104, 105, 107, 113A, and 113B disposed between the conductive substrate layers 101, 103, 106, 108, 112, and 114. In some embodiments, insulating layers may be formed in one or multiple layers. For example, pre-preg layer 113 may be formed in two separate layers 113A and 113B such that devices or other components may be embedded within the pre-preg layers.

The conductive substrate layers may be made of copper, aluminum, gold, silver, metal alloys thereof and other electrically conductive materials. The electrical insulating layers 102, 104, 105, 107, 113A, and 113B may be laminates also known as pre-preg materials. For example, such materials may include cloth or fiber material combined with a resin material, where the cloth to resin ratio determines a laminate type designation (e.g., FR-4, CEM-1, G-10, etc.) and therefore the characteristics of the laminate produced. A variety of materials having dielectric properties include polytetrafluoroethylene (Teflon), FR-4, FR-1, CEM-1 or CEM-3. Other pre-preg materials used in the PCB industry are FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester).

Figure 4:
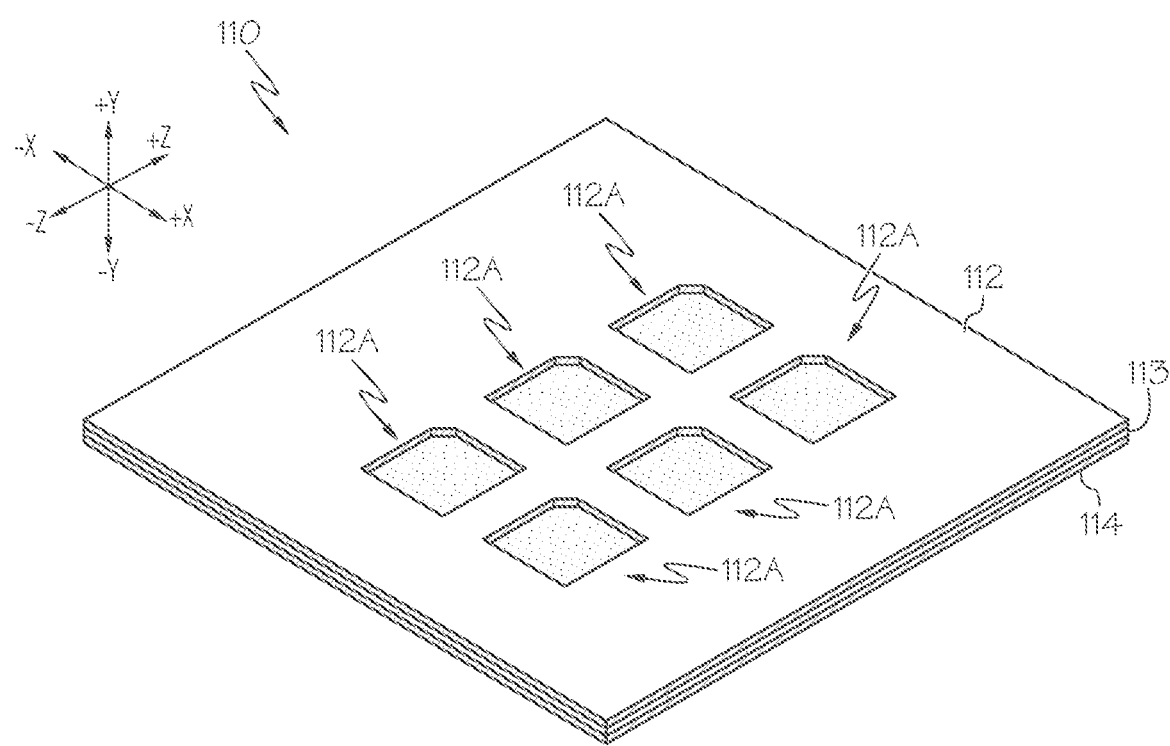
FIG. 4 depicts a perspective view of an illustrative PCB stack post-etching of a first major surface to receive one or more power device stacks according to one or more embodiments shown and described herein.

Turning now to FIGS. 4-8, an illustrative process of forming a power embedded PCB substrate 110 having one or more power devices stacks 130 and one or more flat heat pipes 120. Referring to FIG. 4, a power embedded PCB substrate 110 is depicted. The power embedded PCB substrate 110 includes a first major substrate 112 opposite a second major substrate 114 and a pre-preg layer 113 disposed between the first major substrate 112 and the second major substrate 114. The first major substrate 112 and the second major substrate 114 may be a copper foil laminated to the pre-preg layer 113. In order to prepare the power embedded PCB substrate 110 to receive a power device stack 130 and a flat heat pipe 120, the first major substrate 112 may be etched in a predefined pattern 112A. The predefined pattern 112A may expose the pre-preg layer 113 laminated to the first major substrate 112.

Figure 5:
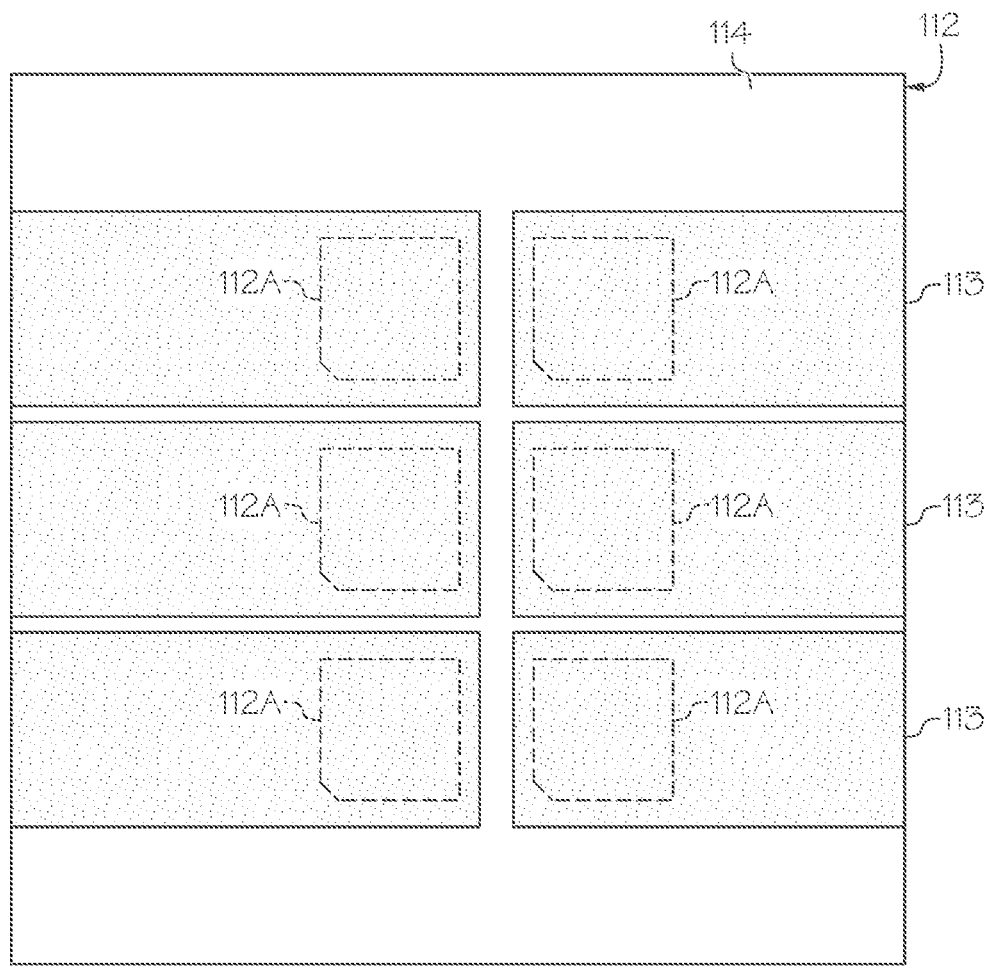
FIG. 5 depicts a bottom view of the illustrative PCB stack shown in FIG. 4 post-etching of a second major surface to receive one or more flat heat pipes according to one or more embodiments shown and described herein.
Figure 6:
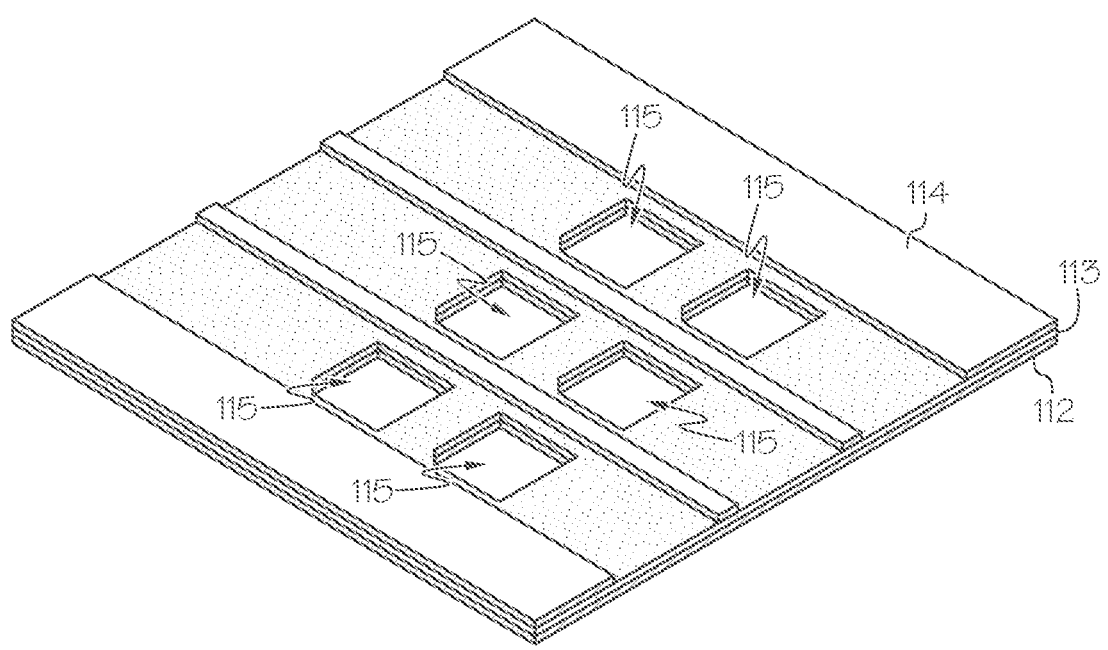
FIG. 6 depicts a perspective view of the bottom of the illustrative PCB stack shown in FIGS. 4 and 5 post-machining of the pre-preg layer to receive one or more flat heat pipes and one or more power device stacks according to one or more embodiments shown and described herein.

Referring now to FIG. 5, which depicts a bottom view of the illustrative power embedded PCB substrate 110 shown in FIG. 4, in a similar manner the second major substrate 114 may be etched in a predefined pattern to expose the pre-preg layer 113 laminated to the second major substrate 114. The predefined pattern may be a pattern corresponding to the flat heat pipe 120 to be embedded within the power embedded PCB substrate 110. Furthermore, as depicted in FIG. 6, the pre-preg layer 113 may then be machined to remove pre-preg material so that the one or more flat heat pipes 120 and the one or more power device stacks 130 coupled thereto may be embedded within the power embedded PCB substrate 110.

Fabricated flat heat pipes 120 may have a thickness of about 1 mm. As discussed above, the flat heat pipe 120 could be made of copper or aluminum or a similar thermally conductive material. If the flat heat pipe 120 is made of aluminum, then the flat heat pipe 120 may be plated with copper in order to be compatible with a PCB fabrication process using copper as the conductive substrate layers.

Figure 7A:
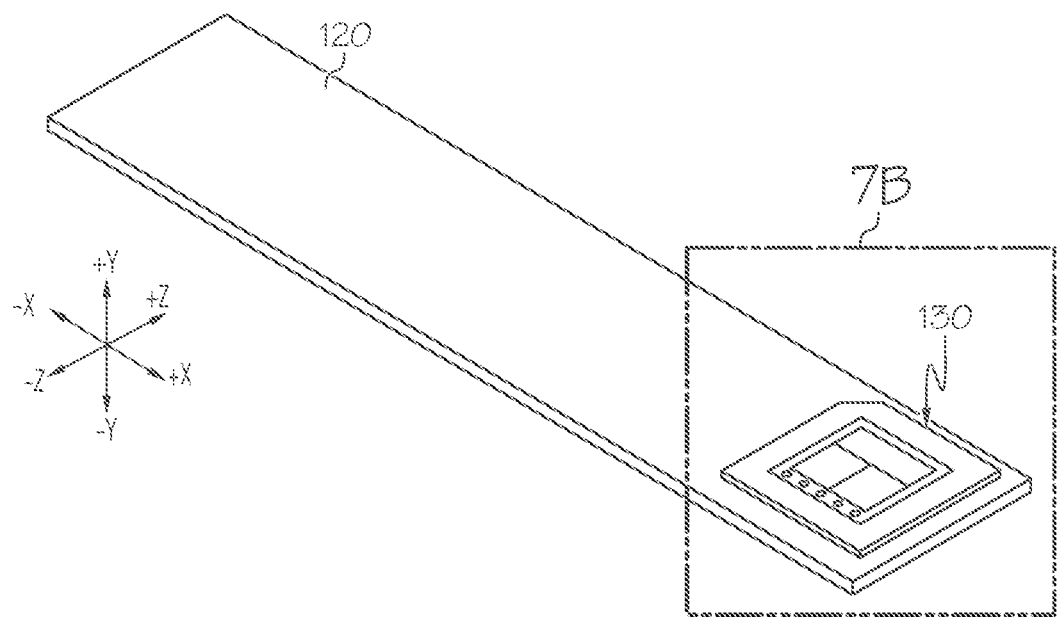
FIG. 7A depicts an illustrative power device stack coupled to a flat heat pipe according to one or more embodiments shown and described herein.
Figure 7B:
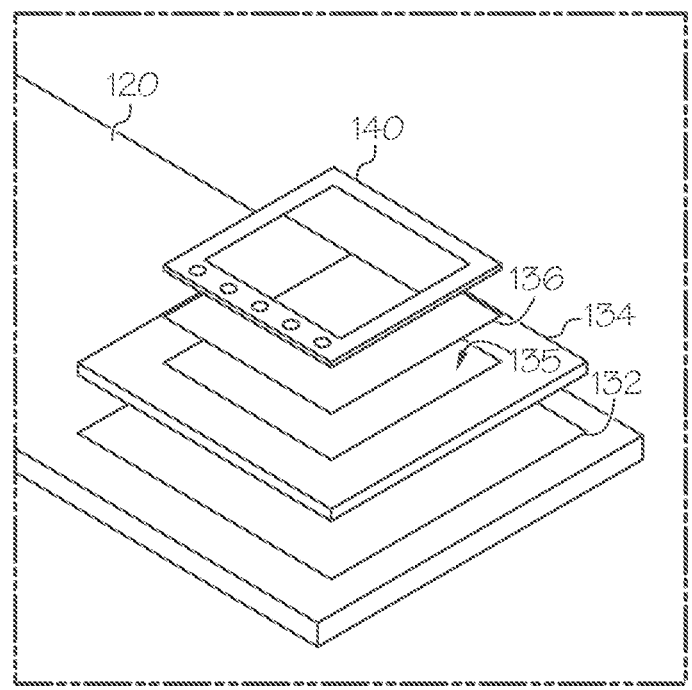
FIG. 7B depicts an exploded view of the power device stack shown in FIG. 7A according to one or more embodiments shown and described herein.

Turning to FIGS. 7A and 7B, the one or more power device stacks 130 may be coupled to a first end of the flat heat pipes 120. The power devices 140 may be bonded to a first substrate 134 (e.g., a copper substrate) using silver sintering 136 or other bonding techniques such as TLP bonding or the like.

The power devices 140 and any others depicted and described herein may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, at least one of the plurality of power devices 140 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the plurality of power devices 140 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power module (including the power devices 140).

Traditional embodiments of power modules including the embedded power devices 140 cannot handle the heat generated by high power semiconductor devices because the thermal conductance paths from the power semiconductor device to cooling devices have undesirable thermal resistances. These thermal resistances are the result of small isolated paths such as vias used for electrical power delivery, which are configured between one or more conductive layers that prohibit the ability for more direct bonding of a cold plate to a direct bonding layer and thus a low thermal resistance path. However, present embodiments utilize the flat heat pipes 120 directly bonded to the power device stacks 130 coupled to the power devices 140. Such a configuration allows for more efficient and effective heat transfer from the power modules including the power devices 140, as described herein. The plurality of power devices 140 may be controlled by a gate drive device (not shown) in the power embedded PCB substrate 110 to change a current type between an alternating current to a direct current, for example.

Still referring to FIG. 7A, the first substrate 134 is further bonded to the flat heat pipe 120 as depicted in FIG. 7B. The power device 140 may be bonded to the first substrate 134 on the first surface thereof. In some embodiments, the first substrate 134 may include a cavity 135 in the first surface that is sized and shaped to receive one or more of the power devices 140 to provide a close mating between the power devices 140 and the first substrate 134. However, this is not a requirement as the power devices 140 may be bonded to the first substrate 134. In some embodiments, the first substrate 134 is further bonded to the flat heat pipe 120 via an electrical insulation layer 132. The electrical insulation layer 132 could be similar to what is used in IMS substrate, where the dielectric serves as medium for the thermal conduction, but also for electrical insulation purposes as well as for bonding copper to copper. In some embodiments, a ceramic layer could be used to direct bond the first substrate 134 to the aluminum substrate of the flat heat pipe 120, which is similar to direct bonded copper (DBC) or direct bonded aluminum (DBA) substrates, or active metal braze (AMB) substrate. The ceramic dielectric layer could be Alumina ($Al_2O_3$), Aluminum nitride (AlN), Beryllium oxide (BeO), or the like. That is, the power device stack 130 may be electrically isolated from the flat heat pipe 120 via an electrical insulation layer 132, however, in other embodiments, the power device stack 130 may be bonded to the flat heat pipe 120 without an electrical insulation layer 132.

Figure 8:
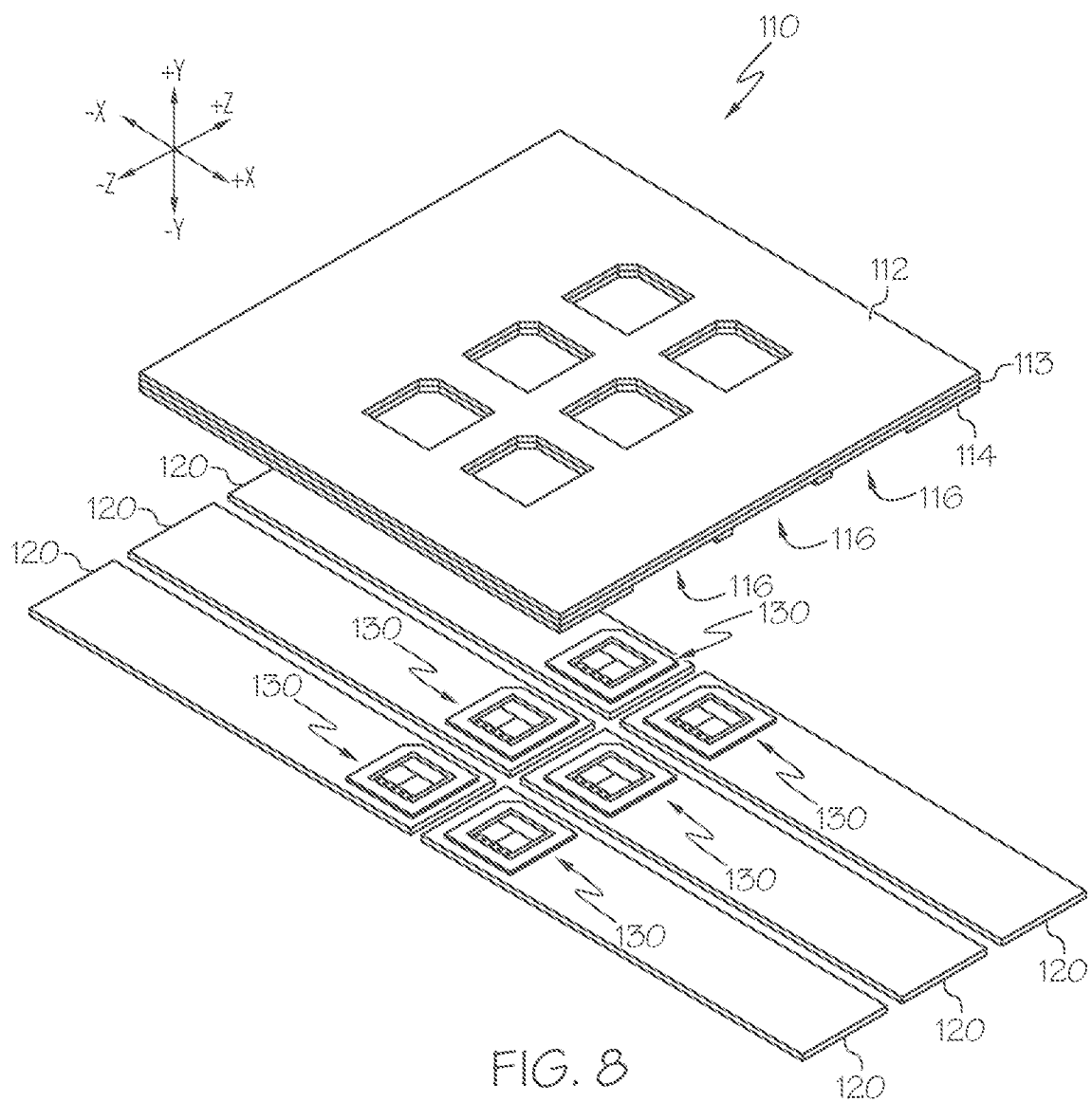
FIG. 8 depicts an illustrative assembly view of illustrative PCB stack shown in FIG. 6 with a plurality of power device stacks coupled to flat heat pipes shown in FIG. 7A according to one or more embodiments shown and described herein.

Turning to FIG. 8, an illustrative assembly view of the illustrative power embedded PCB substrate 110 and flat heat pipe 120 and power device stack 130 assembly shown in FIGS. 6-7B is depicted. With the power embedded PCB substrate 110 etched and machined with recesses 116 corresponding to the size and shape of the one or more flat heat pipes 120 and the one or more power device stacks 130, the assemblies of the one or more flat heat pipes 120 and the one or more power device stacks 130 may be arranged within the power embedded PCB substrate 110. Accordingly, each one of the flat heat pipes 120 extends between a respective one or more of the power device stacks 130 that are also embedded in the power embedded PCB substrate 110. As such, the one or more flat heat pipes 120 are at least partially embedded because a portion of each one of the flat heat pipes 120 extend out of the power embedded PCB substrate 110 to a respective one of the cooling assemblies (e.g., the second end of the flat heat pipes 120). For example, the first end of the flat heat pipes 120 (e.g., an evaporator end) may be embedded within the power embedded PCB substrate 110. In addition, the flat heat pipes 120 may extend out of the power embedded PCB substrate 110 such that the second end of the flat heat pipes 120 (e.g., a condenser end) is not within the power embedded PCB substrate 110.

Figure 9:
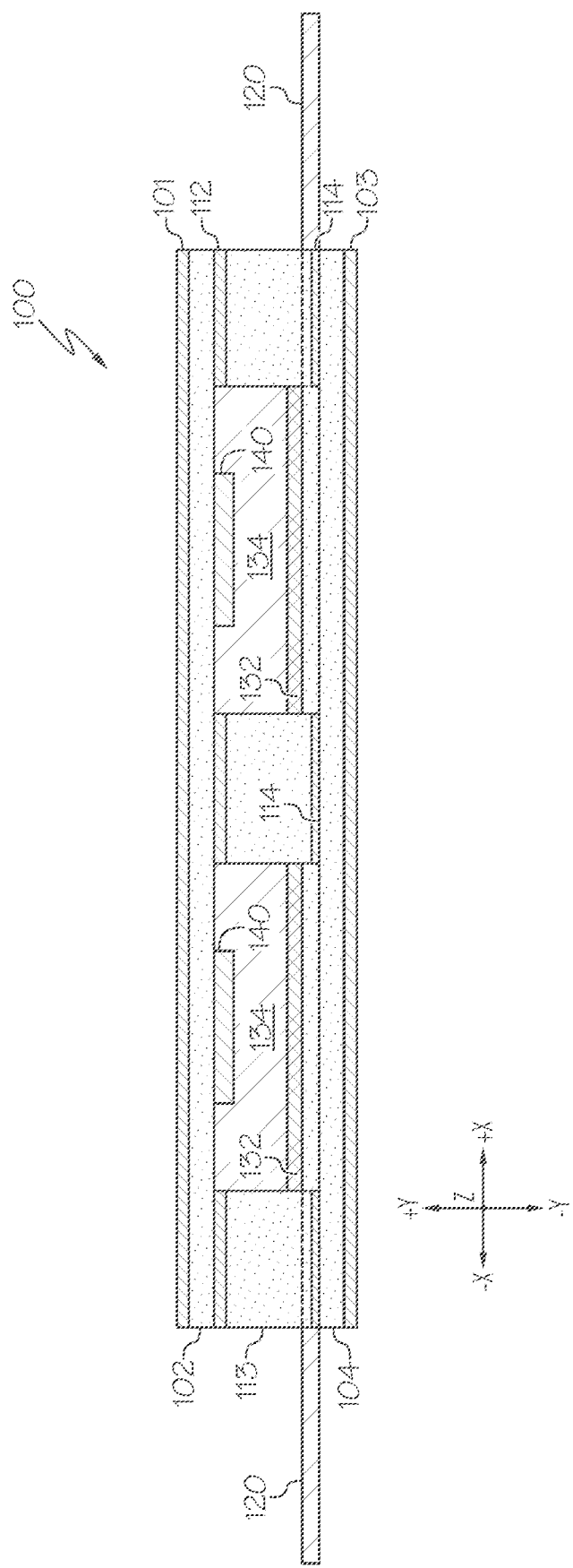
FIG. 9 depicts a cross-sectional side view of an illustrative multi-layer PCB stack having embedded flat heat pipes and power devices according to one or more embodiments shown and described herein.

FIGS. 9-15 and 17-18 depict various PCB stack 100 configurations having embedded flat heat pipes and power devices according to one or more embodiments shown and described herein. Referring first to FIG. 9, a cross-section view of an illustrative PCB stack 100 having embedded flat heat pipes and power devices is depicted according to one or more embodiments shown and described herein. For example, the power embedded PCB substrate 110 (e.g., first major substrate 112, the pre-preg layer 113, and the second major substrate 114) may include one or more conductive layers 101, 103 and electrical insulating layers 102, 104 laminated thereto. Additionally, as depicted in FIG. 9, the flat heat pipes 120 extend from within the power embedded PCB substrate 110 to outside the power embedded PCB substrate 110.

Figure 10:
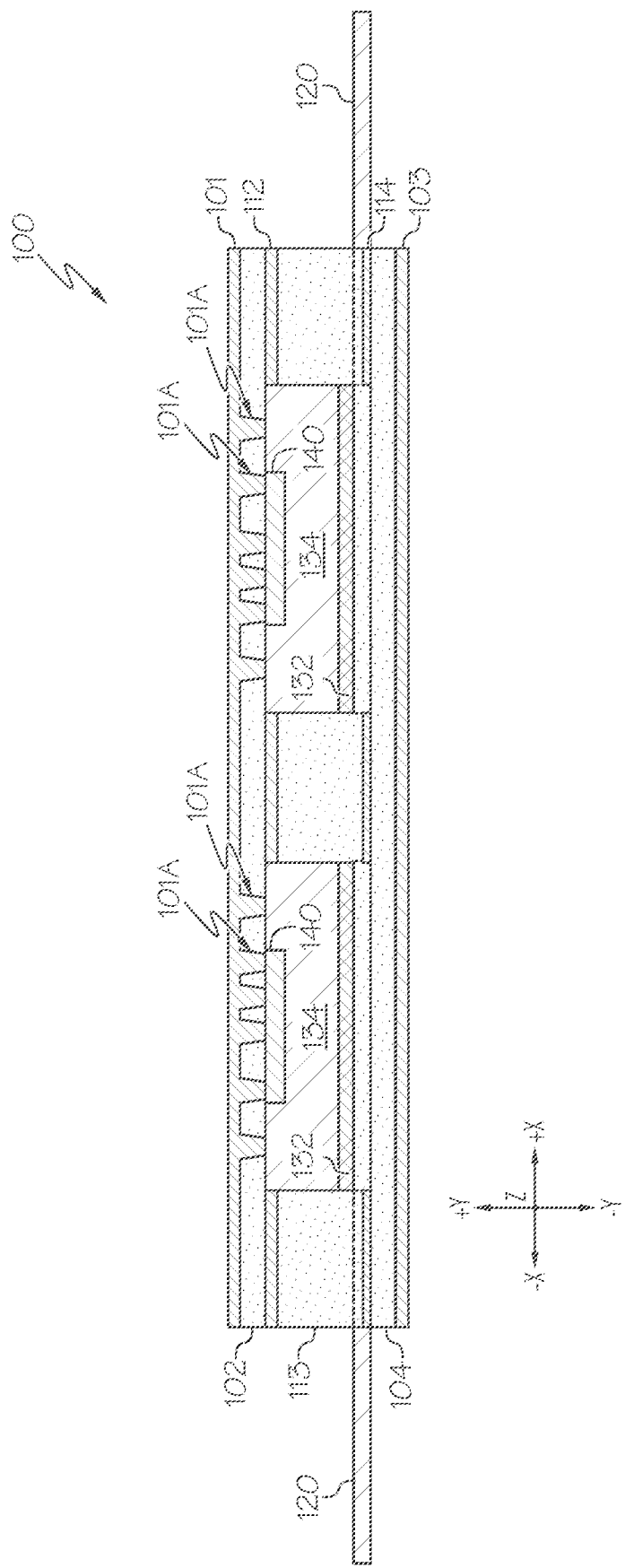
FIG. 10 depicts a cross-sectional side view of the illustrative multi-layer PCB stack shown in FIG. 9 post-drilling and copper plating to form vias interconnecting a power layer with the one or more power device stacks according to one or more embodiments shown and described herein.
Figure 11:
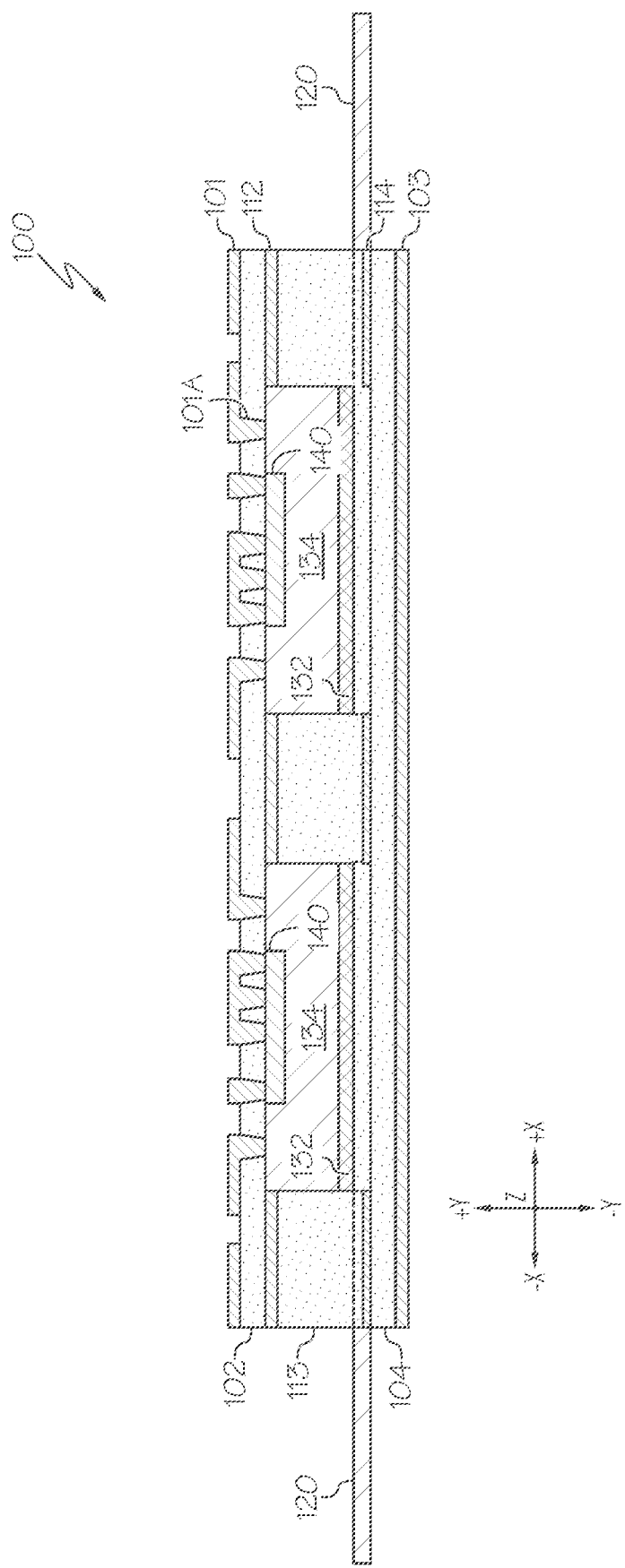
FIG. 11 depicts a cross-sectional side view of the illustrative multi-layer PCB stack shown in FIG. 9 post-etching of the power layer according to one or more embodiments shown and described herein.

The PCB stack 100 may be further processed to form vias 101A between the first power layer 101 and the first major substrate 112 and power devices 140. Referring to FIG. 10, a cross-section view of the PCB stack 100 shown in FIG. 9 is depicted, however, a laser drilling and copper plating process has been implemented to form vias 101A interconnecting the first power layer 101 with the one or more power device stacks 130 (e.g., the power device 140 and the first substrate 134. FIG. 11 depicts a further cross-section view of the PCB stack 100 shown in FIG. 10 where the power layer 101 has been further processed to etch portions of the layer to form electrical pathways therein. Furthermore, the PCB stacks depicted in FIGS. 9-11 include an electrical insulation layer 132 between the first substrate 134 and the flat heat pipes 120.

Figure 12:
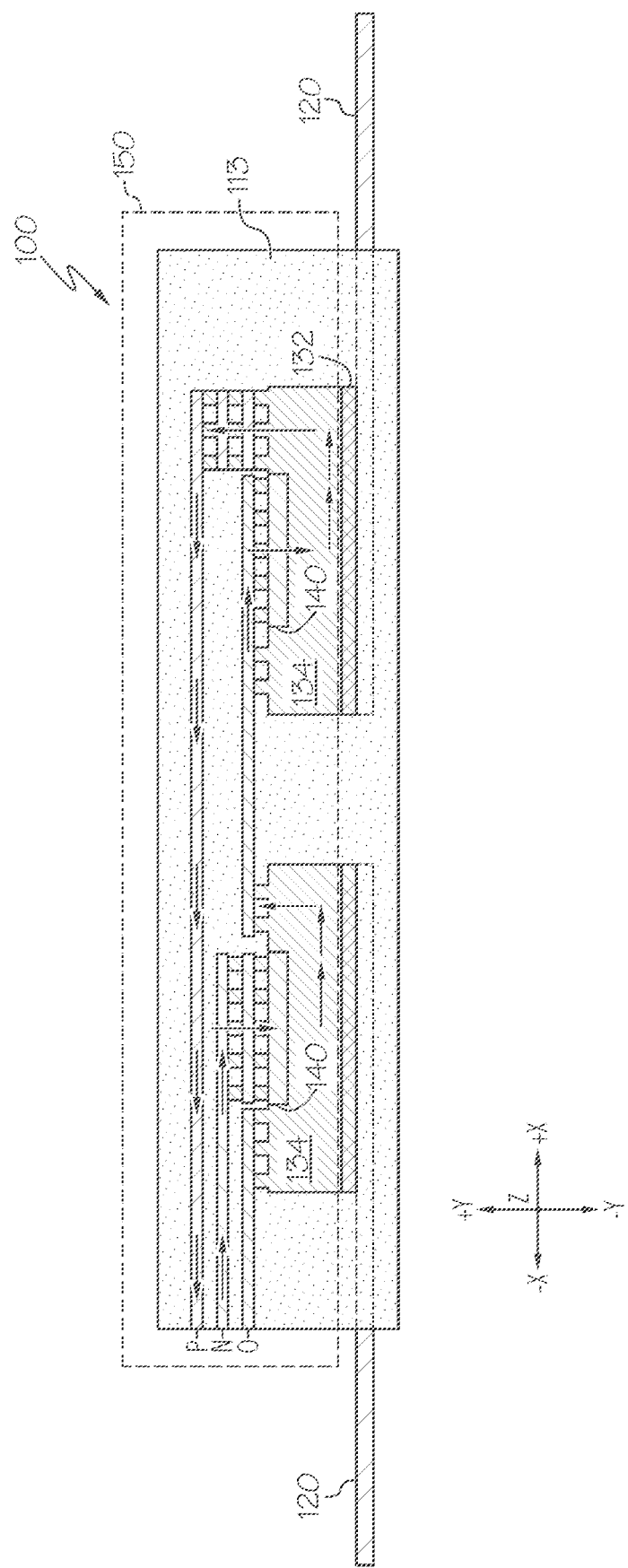
FIG. 12 depicts a cross-sectional side view of a PCB stack with a plurality of power device stacks coupled to flat heat pipes and one or more power layers connected in an illustrative half-bridge of an inverter according to one or more embodiments shown and described herein.

In some embodiments, the one or more power layers (e.g., P, N, O layers) that are formed through lamination, laser drilling, platting, and etching processes may form a half-bridge on an inverter 150 using the embedded power devices 140 as depicted in FIG. 12, for example. This is merely one example electrical system that may be formed within the PCB stack using processes described herein and including an embedded cooling system implementing flat heat pipes 120 embedded therein. In some embodiments, the embedded power devices shown and described herein may be implemented in an inverter topology, a convertor topology, or a similar topology.

Figure 13:
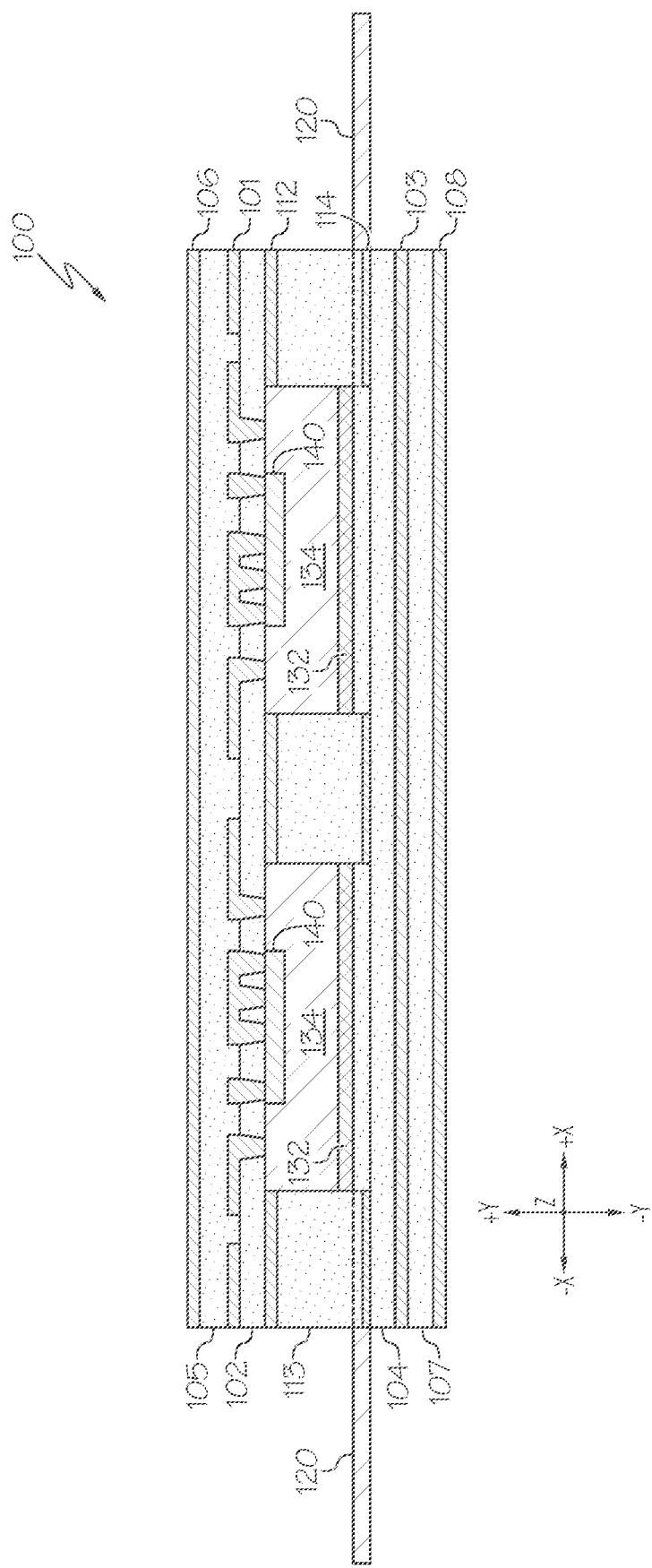
FIG. 13 depicts a cross-sectional side view of the illustrative multi-layer PCB stack shown in FIG. 11 with additional substrate layers laminated thereto according to one or more embodiments shown and described herein.
Figure 14:
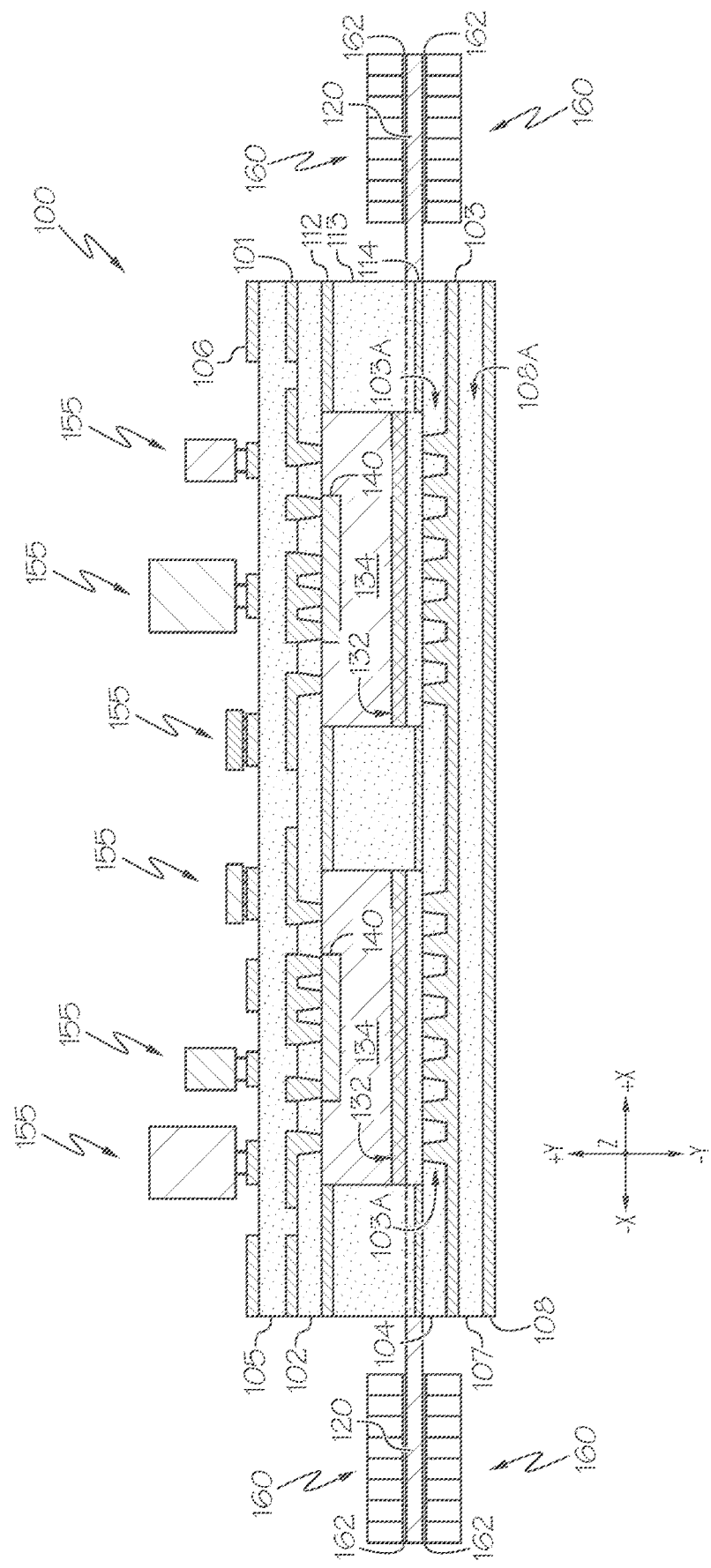
FIG. 14 depicts a cross-sectional side view of an illustrative embedded cooling system within a PCB stack and an external cooling system according to one or more embodiments shown and described herein.

Continuing with FIG. 13, the PCB stack 100 may include further conductive substrate layers 106, 108 and electrical insulating layers 105, 107. These additional layers may provide electrical and/or thermal layers for connecting active or passive components 155 and/or external cooling assemblies 160. FIGS. 14-15 and 17-18 depict examples of assembled embedded power PCBs. FIG. 14 depicts a cross-section view of an illustrative embedded cooling system within a PCB stack 100 and external cooling assemblies 160 coupled to the second end of the flat heat pipes 120. External cooling assemblies 160 may comprise active and/or passive cooling systems. Some external cooling assemblies 160 may include heat sinks such as a fin structure or the like. Some external cooling assemblies 160 may be active cooling systems such as a liquid cooled manifold. In some embodiments, the external cooling assemblies 160 may include a plurality of fins past which coolant fluid may flow to draw heat from the plurality of fins.

In some embodiments, the external cooling assemblies 160 may be coupled to the flat heat pipes 120 via a grease layer 162 or other thermally conductive material that may improve the thermal conductivity between the flat heat pipes 120 and the external cooling assemblies 160. The grease layer 162 may include, for example, epoxies, silicones, urethanes, acrylates, metals, metal-alloys, or any combination thereof. In some embodiments, vias 103A may be formed to couple to the one or more flat heat pipes 120 within the PCB stack 100 to further increase the spreading of heat generated from the power devices 140 embedded therein. In some embodiments, the external cooling assem- blies 160 may not include a heat sink, such as in lower power assemblies (e.g., less than about 40 KW, such as about 5 KW to about 10 KW).

Figure 15:
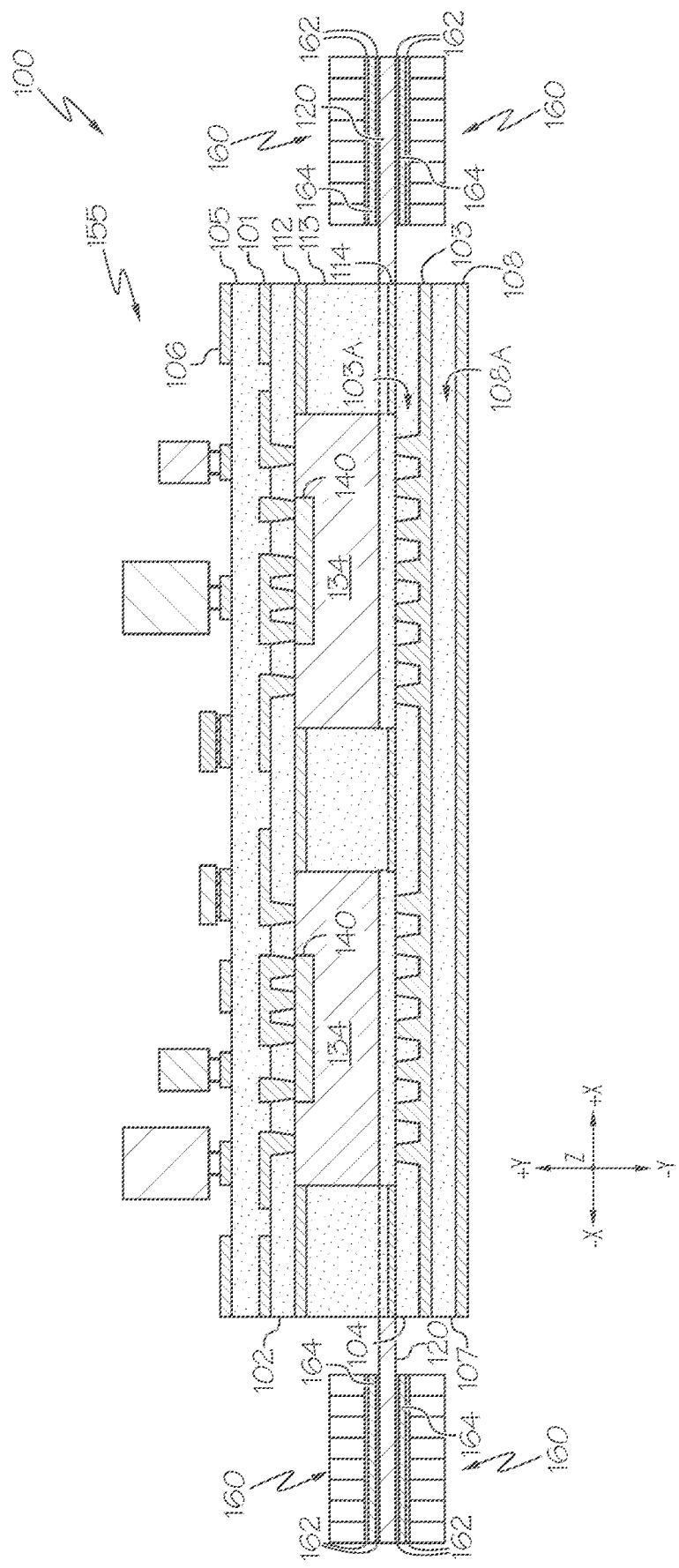
FIG. 15 depicts a cross-sectional side view of another illustrative embedded cooling system within a PCB stack and an external cooling system according to one or more embodiments shown and described herein.

FIG. 15 depicts another illustrative embedded cooling system within a PCB stack and an external cooling system according to one or more embodiments shown and described herein. FIG. 15, in particular, depicts an example where no insulation layer is implemented between the first substrate 134 and the one or more flat heat pipes 120. That is, there is no electrical insulation between the power device 140 and the one or more flat heat pipes 120. In such an instance, the external cooling assemblies 160 may be coupled to the second end of the one or more flat heat pipes 120 via a grease layer 162 and an electrical insulation layer 164.

The electrical insulation layer 164 may include any electrically insulating, thermally conductive material (e.g., beryllium oxide, aluminum nitride, or the like) or combination of materials. The electrical insulation layer 164 may be in contact with one or more layers of the external cooling assemblies 160 through a TIM (Thermal Interface Material) layer to ensure contact in some embodiments. In some embodiments, the one or more TIM layers may be electrically insulating to electrically isolate one or more layers of the external cooling assemblies 160 and may in some embodiments form an electrical insulation layer 164 therebetween.

Figure 16:
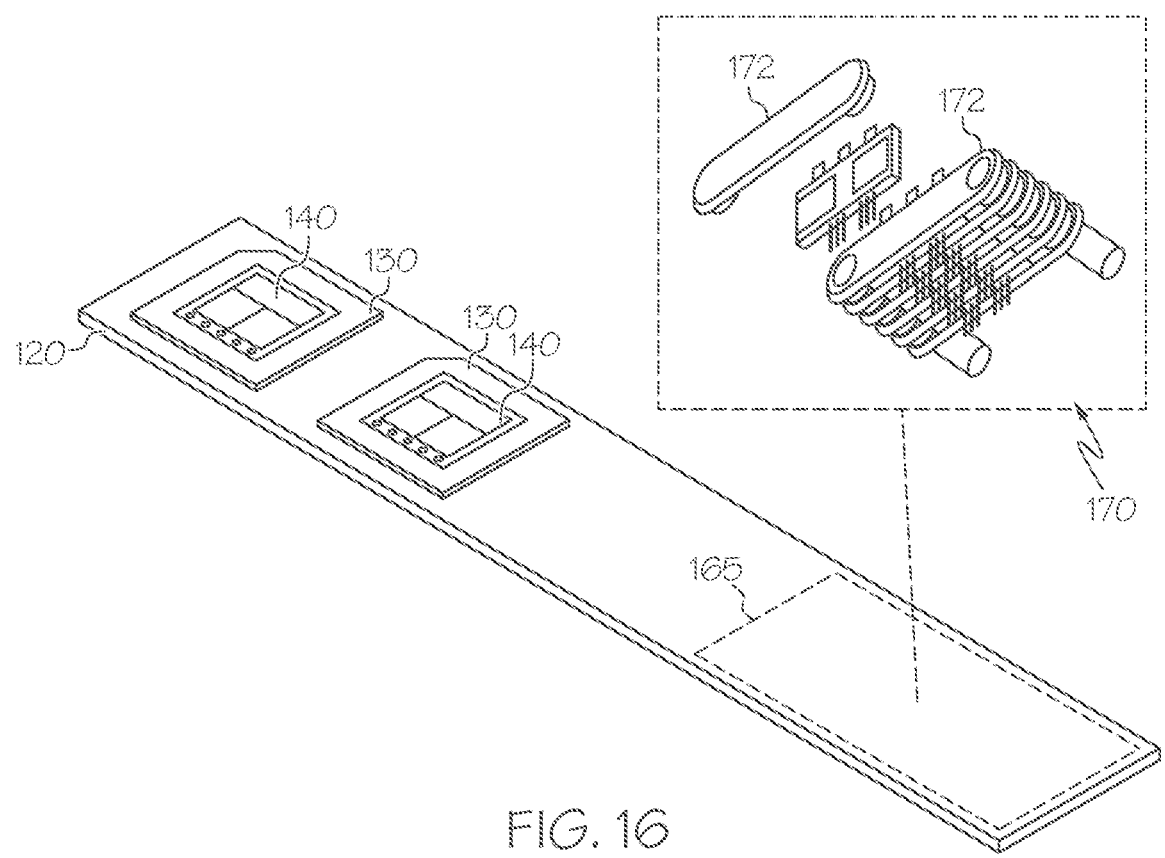
FIG. 16 depicts a flat heat pipe coupled to a plurality of power device stacks and a cooling manifold attached to the flat heat pipe according to one or more embodiments shown and described herein.

Turning to FIG. 16, a flat heat pipe 120 having a plurality of power device stacks coupled to a first end of the flat heat pipe 120 is depicted. Furthermore, the second end 165 of the flat heat pipe 120 is coupled to a cooling manifold 170. Although the previously depicted embodiments depict only one power device stack 130 being coupled to a flat heat pipe 120, this is merely an example. In some embodiments, a plurality of power device stacks 130 may be thermally coupled to a single flat heat pipe 120. In some embodiments, the cooling manifold 170 may be a cooling assembly having a plurality of cold plates 172 where the second end 165 of one or more flat heat pipes 120 are positioned between a pair of cold plates 172. The cold plates 172 may be fluidly coupled to a fluid inlet and fluid outlet that facilitates the flow of fluid through or around the cold plates 172 to increase the extraction of heat from the flat heat pipes 120.

Figure 17:
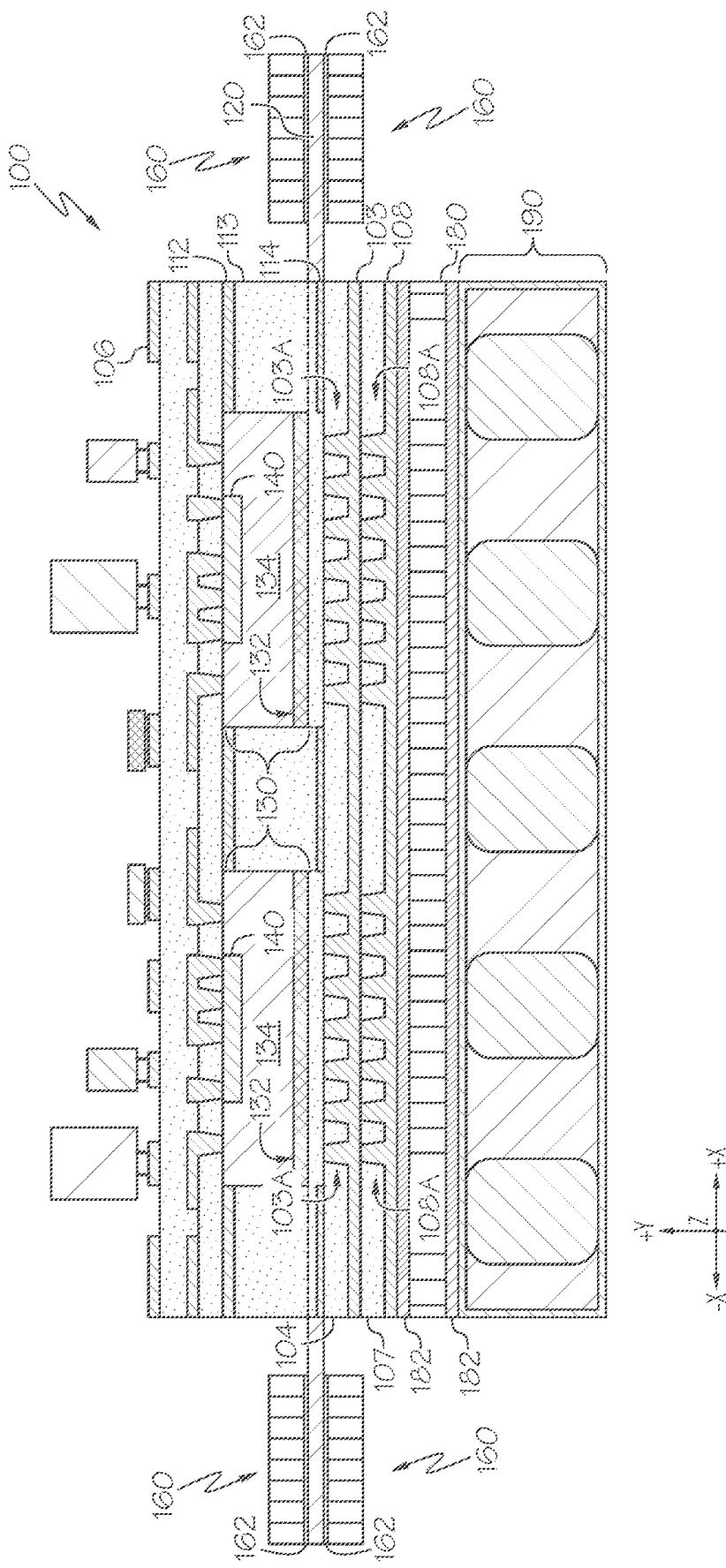
FIG. 17 depicts a cross-sectional side view of an illustrative embedded cooling system integrated within a high power application according to one or more embodiments shown and described herein.
Figure 18:
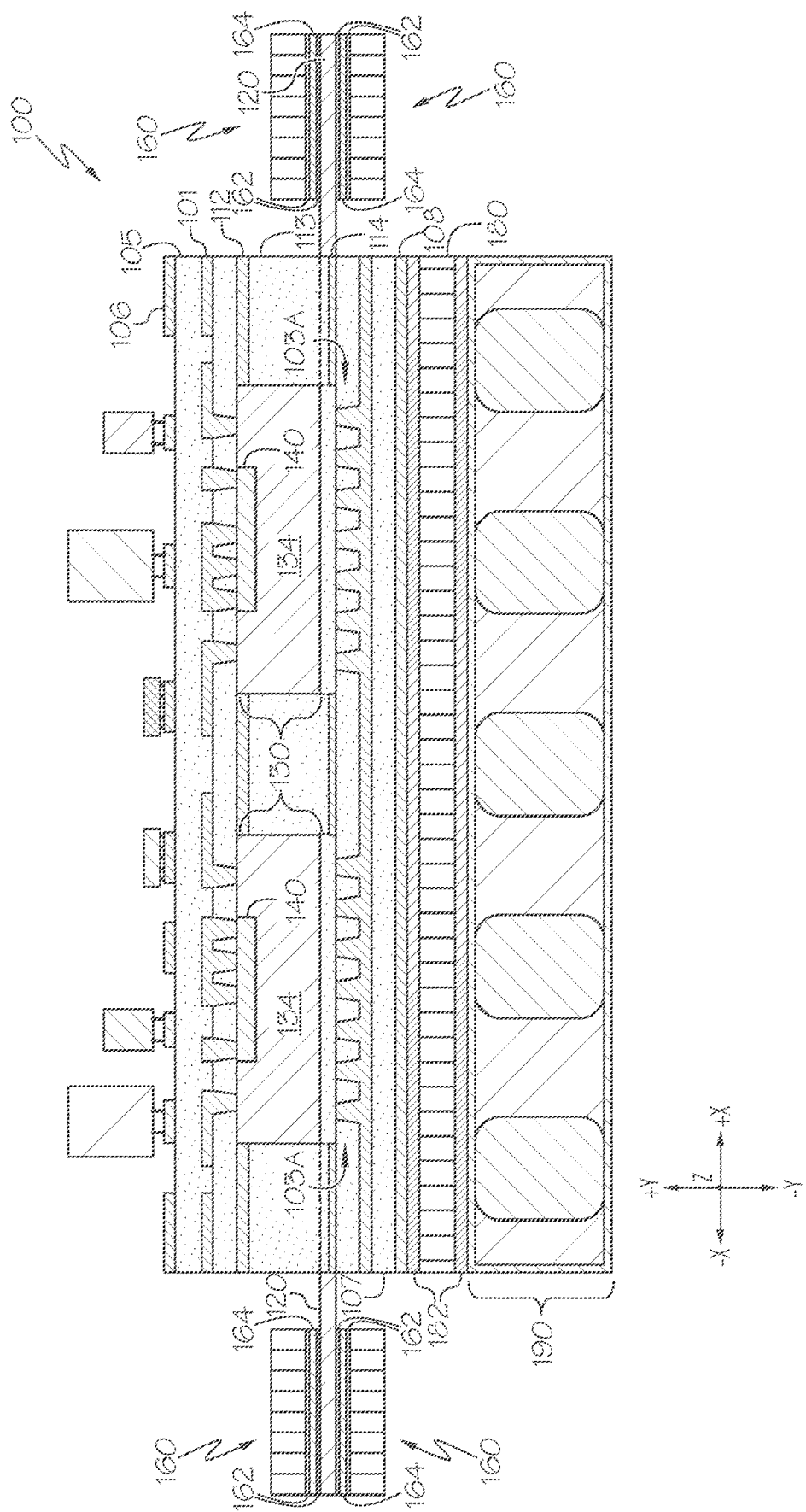
FIG. 18 depicts a cross-sectional side view of another illustrative embedded cooling system integrated in a high power application according to one or more embodiments shown and described herein.

FIGS. 17 and 18 depict additional illustrative embodiments of an embedded cooling system within a PCB stack 100 coupled to an external power device. The PCB stack 100 depicted in FIG. 17 corresponds to the PCB stack 100 depicted in FIG. 14 in that an electrical insulation layer 132 is implemented between the power device 140 and the flat heat pipe 120. However, FIG. 17 further includes a capacitor pack 190 thermally coupled to the PCB stack 100. With the flat heat pipes 120 electrically isolated from the power devices 140, vias 103A and 108A may be implement between the conductive substrate layers 103 and 108 and a cooler 180. The capacitor pack 190 is coupled to the cooler 180 via one or more grease layers 182 to enable heat transfer from the capacitor pack 190 or other power device externally coupled to the PCB stack 100. In a similar embodiment, FIG. 18 depicts another embodiment of a PCB stack 100 coupled to an external power device such as a capacitor pack 190. However, in FIG. 18 the power device 140 is not electrically isolated from the flat heat pipes 120. Therefore, an electrical insulating layer 107 is implemented to electrically isolate the capacitor pack 190 and the cooler 180 from the power devices 140. The electrical insulating layer 107 may be a pre-preg layer where no vias 108A are implemented between conductive substrate layers 103 and 108.

As previously described herein, the number of external cooling assemblies 160 is not limited by the present disclosure, and a single external cooling assembly 160 may be used to cool any number of flat heat pipes 120 (which are used to cool any number of power devices 140). For example, as shown in FIGS. 14-15 and 17-18, the external cooling assemblies 160 are thermally coupled to power device stacks 130 via a corresponding flat heat pipes 120. As further illustrated in FIG. 8, the power device stacks 130 with the power devices 140 thereon are arranged in a 3×2 array. However, this is merely one illustrative embodiment, and other arrangements are contemplated and included within the scope of the present disclosure.

Figure 19:
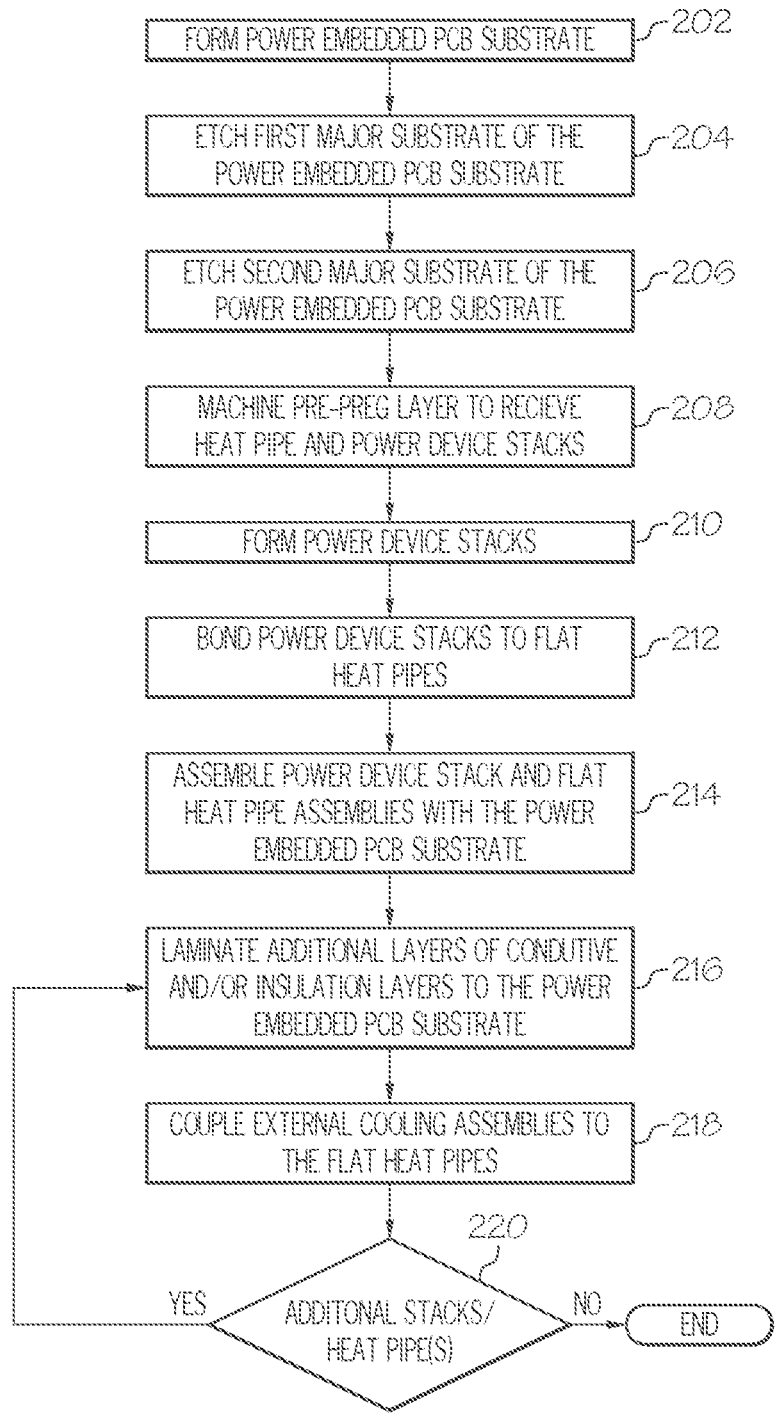
FIG. 19 depicts a flow diagram of an illustrative method of forming an embedded cooling system according to one or more embodiments shown and described herein.

The various embedded cooling systems described herein should now be generally understood. Turning to FIG. 19, a method of forming an illustrative PCB stack 100 having an embedded cooling system will now be described. It should be understood that the order of the process described herein with respect to FIG. 19 is merely illustrative, and that the present disclosure is not limited to the order described herein. An illustrative example of a particular ordering of steps will be described herein, but the present disclosure is not limited to such an example.

Referring to FIG. 19, the method 200 includes forming a power embedded PCB substrate 110 having one or more embedded flat heat pipes 120 for extracting heat from one or more embedded power devices 140. At block 202, a power embedded PCB substrate 110 is formed. The power embedded PCB substrate 110 may be formed by laminating a first major substrate, a second major substrate and a pre-preg layer disposed between the first major substrate and the second major substrate together. The power embedded PCB substrate 110 may be processed using an etching process applied to the first major substrate 112 to etch out a predetermined pattern corresponding to the size and shape of one or more power device stacks 130 at block 204. FIG. 4 depicts an illustrative example of the power embedded PCB substrate 110 post-etching. At block 206, the power embedded PCB substrate 110 is further processed using an etching process applied to the second major substrate 114 to etch out a predetermined pattern corresponding to the size and shape of one or more flat heat pipes 120. FIG. 5 depicts an illustrative example of the power embedded PCB substrate 110 post-etching on the second major substrate 114. At block 208, the pre-preg layer 113 is machined to remove pre-preg material such that the one or more power device stacks 130 and the one or more flat heat pipes 120 may be received within the power embedded PCB substrate 110. FIG. 6 depicts an illustrative example of the power embedded PCB substrate 110 post-machining of the pre-preg layer 113.

At block 210, one or more power device stacks 130 are formed. A first substrate 134 is coupled to a power device 140. In some embodiments, the first substrate 134 (e.g., a first copper substrate) is formed with a cavity 135 (FIG. 7B) therein, the cavity 135 being shaped and sized to receive one or more power devices therein, as described herein. In some embodiments, the first substrate may be formed by providing a substrate and machining the cavity 135 by removing material therefrom (e.g., machining the cavity 135). In other embodiments, the first substrate may be formed such that a cavity 135 is present within the substrate (e.g., forming via an additive manufacturing process or the like). In some embodiments, the cavity 135 may not be formed (e.g., embodiments where the power device is placed directly on a surface of the substrate not including a cavity 135 therein). At block 212, the one or more power device stacks 130 are thermally coupled to the one or more flat heat pipes 120. The first substrate 134 of the one or more power device stacks 130 may be bonded to the one or more flat heat pipes 120 via an electrical insulation layer 132. The electrical insulation layer 132 could be similar to what is used in IMS substrate, where the dielectric serves as medium for the thermal conduction, but also for electrical insulation purposes as well as for bonding copper to copper. In some embodiments, a ceramic layer could be used to direct bond the first substrate 134 to the aluminum substrate of the flat heat pipe 120, which is similar to direct bonded copper (DBC) or direct bonded aluminum (DBA) substrates, or active metal braze (AMB) substrate. The ceramic dielectric layer could be Alumina ($Al_2O_3$), Aluminum nitride (AlN), Beryllium oxide (BeO), or the like. That is, the power device stack 130 may be electrically isolated from the flat heat pipe 120 via an electrical insulation layer 132, however, in other embodiments, the power device stack 130 may be bonded to the flat heat pipe 120 without an electrical insulation layer 132. FIGS. 7A and 7B depict illustrative assembled views of the one or more flat heat pipes 120 and the one or more power device stacks 130.

At block 214, the flat heat pipes 120 and power device stacks 130 assemblies are arranged and fastened within the recesses formed within the power embedded PCB substrate 110. Fastening techniques such as bonding or adhering with resin may be used. At block 216, one or more additional layers of conductive and/or insulating layers of material may be laminated to the top and/or bottom of the power embedded PCB substrate 110. These layers may be further processed with etching, drilling, machining, and other processes to form interconnected layers for electrical power transfer as well as thermal conductance.

At block 218, cooling assemblies may be coupled to the second end of the one or more flat heat pipes 120 extending out of the power embedded PCB substrate 110. FIGS. 14-18 include illustrative embodiments of external cooling assemblies 160 coupled to the flat heat pipes 120.

At block 220, a decision is made as to whether the embedded cooling system includes additional stacks, power devices, and flat heat pipes (e.g., embodiments containing a plurality of stacks, power devices, and/or flat heat pipes, as described herein). If additional components are to be added to the embedded cooling system, the process may repeat at block 216. If no further components are to be added, the process may end.

It should now be understood that the embedded cooling systems described herein include power devices (e.g., embedded power semiconductor devices) and heat pipes, such as flat heat pipes embedded within substrates such as gate driver printed circuit boards (PCBs). The embedded power devices shown and described herein utilize copper layers and/or insulation layers to form an inverter topology, a convertor topology, or a similar topology. One or more of the copper layers are formed to receive the embedded flat heat pipes, which are configured to extend from the copper layer(s) to a location outside of the substrate, the location having a cooling assembly that facilitates heat transfer from the power devices out of the PCBs.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A system comprising:
    a PCB stack comprising a first major substrate opposite a second major substrate;
    a pre-preg layer disposed between the first and second major substrates;
    a power device stack embedded within the PCB stack and comprising a substrate;
    a power device coupled to the substrate of each power device stack, the substrate of each power device stack comprising a cavity for receiving the power device; and
    a flat heat pipe having a first end embedded in the PCB stack and a second end extending outside the PCB stack, the power device stack being coupled to the flat heat pipe.

2. The system of claim 1, further comprising a cooling assembly arranged externally to the PCB stack, wherein the second end of the flat heat pipe is at least partially disposed within the cooling assembly.

3. The system of claim 2, wherein the cooling assembly further comprises:
    an insulation layer disposed on at least one side of a portion of the second end of the flat heat pipe and the cooling assembly thermally coupled to the flat heat pipe wherein the insulation layer is disposed between the cooling assembly and the flat heat pipe.

4. The system of claim 1, wherein the flat heat pipe comprises:
    an enclosed tube having a porous layer disposed on an interior surface of the enclosed tube, and
    a liquid disposed within the enclosed tube, wherein heat generated by the power device vaporizes the liquid within the flat heat pipe at the first end and the vaporized liquid condenses back to a liquid phase at the second end of the flat heat pipe.

5. The system of claim 1, wherein one or more recesses are formed in the second major substrate and the pre-preg layer, the one or more recesses shaped and sized to receive the flat heat pipe and the power device stack therein.

6. The system of claim 1, wherein the substrate is formed from copper, aluminum, gold, silver, or an alloy thereof.

7. The system of claim 1, wherein the power device stack further comprises an electrical insulation layer positioned between the substrate and the flat heat pipe.

8. The system of claim 7, wherein the electrical insulation layer is a ceramic dielectric layer or an insulated metal substrate (IMS) dielectric layer.

9. The system of claim 1, wherein the PCB stack comprises one or more power conductive layers electrically coupled to the power device via one or more vias.

10. The system of claim 1, wherein the PCB stack comprises one or more power conductive layers and one or more active or passive components electrically coupled to the one or more power conductive layers.

11. The system of claim 1, wherein the first end of the flat heat pipe extends in a first direction and the second end of the flat heat pipe extends in a second direction, the first direction being transverse the second direction.

12. The system of claim 1, wherein the power device stack comprises a plurality of power device stacks arranged in an array, wherein two of the plurality of power device stacks are coupled to each one of the flat heat pipe.

13. The system of claim 1, wherein a power module comprising the PCB stack and the power device has a power rating greater than or equal to 40 kilowatts (kW).

14. A method comprising:
    forming a PCB stack having a first major substrate opposite a second major substrate and a pre-preg layer disposed between the first and second major substrates;
    forming a recess within the PCB stack to receive a power device stack coupled to a flat heat pipe, the power device stack comprising a substrate having a cavity for receiving a power device; and
    embedding the power device stack coupled to the flat heat pipe within the recess, the flat heat pipe comprising first and second ends, the first end embedded within the PCB stack and the second end extending outside of the PCB stack.

15. The method of claim 14, wherein forming the recess within the PCB stack comprises:
    etching the first major substrate and the second major substrate; and
    machining the pre-preg layer, wherein the etched first major substrate, the etched second major substrate, and the machined pre-preg layer form the recess to receive the power device stack coupled to the flat heat pipe.

16. The method of claim 14, further comprising:
    machining the cavity within the substrate to receive the power device;
    bonding the power device to the substrate to form the power device stack; and
    bonding the power device stack to the first end of the flat heat pipe.

17. The method of claim 16, wherein the power device stack is bonded to the first end of the flat heat pipe via an electrical insulation layer disposed between the power device stack and the flat heat pipe.

18. A system comprising:
    a printed circuit board (PCB) stack comprising a first major substrate opposite a second major substrate and a pre-preg layer disposed between the first and second major substrates;
    a plurality of power device stacks embedded within the PCB stack, each comprising a substrate having a cavity formed therein and an electrical insulation layer disposed on a surface of the substrate opposite the cavity;
    a plurality of power devices, each of the plurality of power devices received within the cavity of the substrate of each of the plurality of power device stacks and thermally coupled to the substrate;
    one or more flat heat pipes having a first end embedded within the PCB stack and thermally bonded to the electrical insulation layer of one or more of the plurality of power device stacks and a second end extending outside of the PCB stack; and
    at least one cooling assembly arranged externally to the PCB stack such that the second end of the one or more flat heat pipes partially disposed within the at least one cooling assembly.

19. The system of claim 18, wherein the PCB stack comprises one or more power conductive layers electrically coupled to the plurality of power devices via one or more vias.

* * * * *